(12) United States Patent
Kelsey

(10) Patent No.: US 6,926,876 B2
(45) Date of Patent: Aug. 9, 2005

(54) PLASMA PRODUCTION OF POLYCRYSTALLINE SILICON

(76) Inventor: Paul V. Kelsey, 2803 Bexley Ct., Wilmington, DE (US) 19808

(*) Notice: Subject to any disclaimer, the term of this patent is extended or adjusted under 35 U.S.C. 154(b) by 255 days.

(21) Appl. No.: 10/346,601

(22) Filed: Jan. 17, 2003

(65) Prior Publication Data

US 2003/0133853 A1 Jul. 17, 2003

Related U.S. Application Data

(60) Provisional application No. 60/348,939, filed on Jan. 17, 2002.

(51) Int. Cl.[7] .............................................. C01B 33/027
(52) U.S. Cl. ......................... 423/348; 433/349; 433/350
(58) Field of Search ................................ 423/348, 349, 423/350

(56) References Cited

U.S. PATENT DOCUMENTS

| | | | | |
|---|---|---|---|---|
| 4,176,166 A | * | 11/1979 | Carman ...................... 423/350 |
| 4,292,342 A | * | 9/1981 | Sarma et al. ................. 264/81 |
| 4,321,246 A | * | 3/1982 | Sarma et al. ............... 423/350 |
| 4,377,564 A | * | 3/1983 | Dahlberg .................... 423/349 |
| 4,668,331 A | * | 5/1987 | Ostriker ......................... 117/8 |
| 5,221,643 A | * | 6/1993 | Griep ........................ 438/488 |

* cited by examiner

Primary Examiner—Ngoc-Yen Nguyen
(74) Attorney, Agent, or Firm—Sheridan Ross P.C.

(57) ABSTRACT

The invention is directed to a method of producing polycrystaline silicon metal from a silicon halide plasma source. The silicon halide is split into silicon and halide ions in an inductively coupled plasma and silicon ions are then condensed to form molten silicon metal that can be vacuum cast into polysilicon ingots. The halide ions are separated and recycled into silicon halide gas over a silicon dioxide bed. In this way, high grade polysilicon is produced without a metallurgical grade silicon precursor and the process these processes consumes the byproducts in a continuous manner madding it less expensive than traditional methods of producing polysilicon and more environmentally friendly.

43 Claims, 4 Drawing Sheets

PLASMA PRODUCTION OF POLYCRYSTALLINE SILICON

CROSS REFERENCE TO RELATED APPLICATIONS

This application claims benefit under 35 USC § 119(e) of U.S. Provisional Application No. 60/348,939, filed Jan. 17, 2002, which is incorporated herein in its entirety by this reference.

TECHNICAL FIELD OF THE INVENTION

The invention is directed to a method of producing semiconductor grade silicon from a silicon halide plasma source followed by condensation of silicon ions to form molten silicon metal.

BACKGROUND OF THE INVENTION

Crystal growth is a very orderly and regulated process. Often many small crystals begin forming in solution and grow until their edges meet at varying angles. They do not join to form a single large crystal but rather remain a mass of small individual crystals forming a polycrystalline mass. Polycrystalline silicon metal (polysilicon) is a precursor to the manufacture of silicon single crystals used extensively in the microelectronics industry. Most of the current manufacturing schemes for the production of high purity polysilicon use metallurgical grade silicon as the starting material. This material is most often produced via a direct reduction of $SiO_2$ in an electric submerged arc furnace. Coal and coke are used as carbon sources with sand or quartzite as the source of silica in the reaction:

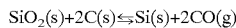

$$SiO_2(s)+2C(s) \leftrightarrows Si(s)+2CO(g)$$

The resulting metallurgical grade silicon (MGS) is further processed into gaseous precursors that are generally associated with polysilicon production. A typical process flow diagram for producing semiconductor grade polysilicon via a trichlorosilane ($SiCl_3H$) intermediate was described by O'Mara, W, C., Herring, R. D., and Hunt, L. P., (1990) *Handbook of Semiconductor Technology*, Noyes Publications, Park Ridge, N.J., pp. 2–16, and is shown in FIG. 1.

In this process, ground MGS is treated with HCl to form trichlorosilane through a series of intermediate fractional distillation steps. The trichlorosilane can be directly reduced with $H_2$ to produce polysilicon as in the Siemens process in which a mixture of trichlorosilane and hydrogen is guided, in a bell-jar reactor, over thin silicon rods which are heated by the passage of direct current to approximately 1110° C., producing polycrystalline silicon in the form of rods. Trichlorosilane can also be reacted with hydrogen in a series of reactions to form silane ($SiH_4$). Silane is often preferred over trichlorosilane, despite the low silicon deposition rate for silane, due to the ease of purifying the silane gas in the production of high purity silicon.

There are many variations and intermediate products that are used in the industry to produce high purity polysilicon. Intermediate products such as $SiCl_2H_2$ are sold to manufacturers of polysilicon and wafer producers. However, most of the processes require a starting material of MGS, thereby requiring at least two separate operations; one to make the MGS and another to convert the MGS into polysilicon. In some instances three operations are required because the intermediate process to make trichlorosilane or silane is separated as a stand-alone operation. This is expensive and often requires the separation of the different processing steps into different facilities or locations. Thus, a less expensive process for the production of polysilicon metal which would allow the operation to be conducted in one facility is desired.

SUMMARY OF THE INVENTION

The invention embodies a process for the production of polysilicon that utilizes a plasma source to break down a silicon halide in the presence of hydrogen. Si ions react with electrons introduced via the hydrogen to form molten silicon metal condensate that can be vacuum cast into polysilicon ingots.

One embodiment of the invention is directed to a fluorine based system in which $SiF_4$ decomposes to silicon and fluorine ions which react with the hydrogen gas in the plasma to allow condensation of polysilicon and recycling of the fluorine into $SiF_4$ through a silicon dioxide bed.

In another embodiment of the invention, a chlorine based system is used to produce polysilicon from $SiCl_4$. This system functions in the same way as the fluorine based system while allowing higher condensation temperatures and lower containment costs.

These embodiments represent a transfer of silicon from $SiO_2$ to polysilicon without the production of metallurgical grade silicon. These embodiments have the advantage of eliminating the need of producing MGS as a precursor in the production of polysilicon, significantly lowering the cost of producing semiconductor grade silicon. The cost is further lowered over the prior art procedures as the entire operation can be contained in one facility which will lower the costs of operating multiple facilities. Additionally, these processes consume by products in a continuous manner, and are therefore environmentally friendly.

In another embodiment, either $SiF_4$ or $SiCl_4$ are obtained from an inexpensive source and decomposed in the same plasma source to produce polysilicon. This is done without the subsequent recycling of the halide ions. Instead, these ions are contained through the use of a hydroxide solution to form alkaline fluorides with commercial value.

In this embodiment, the by-products that are not re-cycled have a commercial value and, therefore, do not pose an environmental liability.

DETAILED DESCRIPTION OF THE INVENTION

The present invention encompasses a method of transferring silicon from $SiO_2$ to polysilicon without the production of metallurgical grade silicon or the use of a metallurgical grade silicon intermediate. The invention is embodied in a process utilizing an inductively coupled plasma in the presence of hydrogen to break down a silicon halide and the subsequent reformation of the silicon halide via the reaction between the halide gas and silica feedstock in a fluidized bed reactor.

Figure 1:
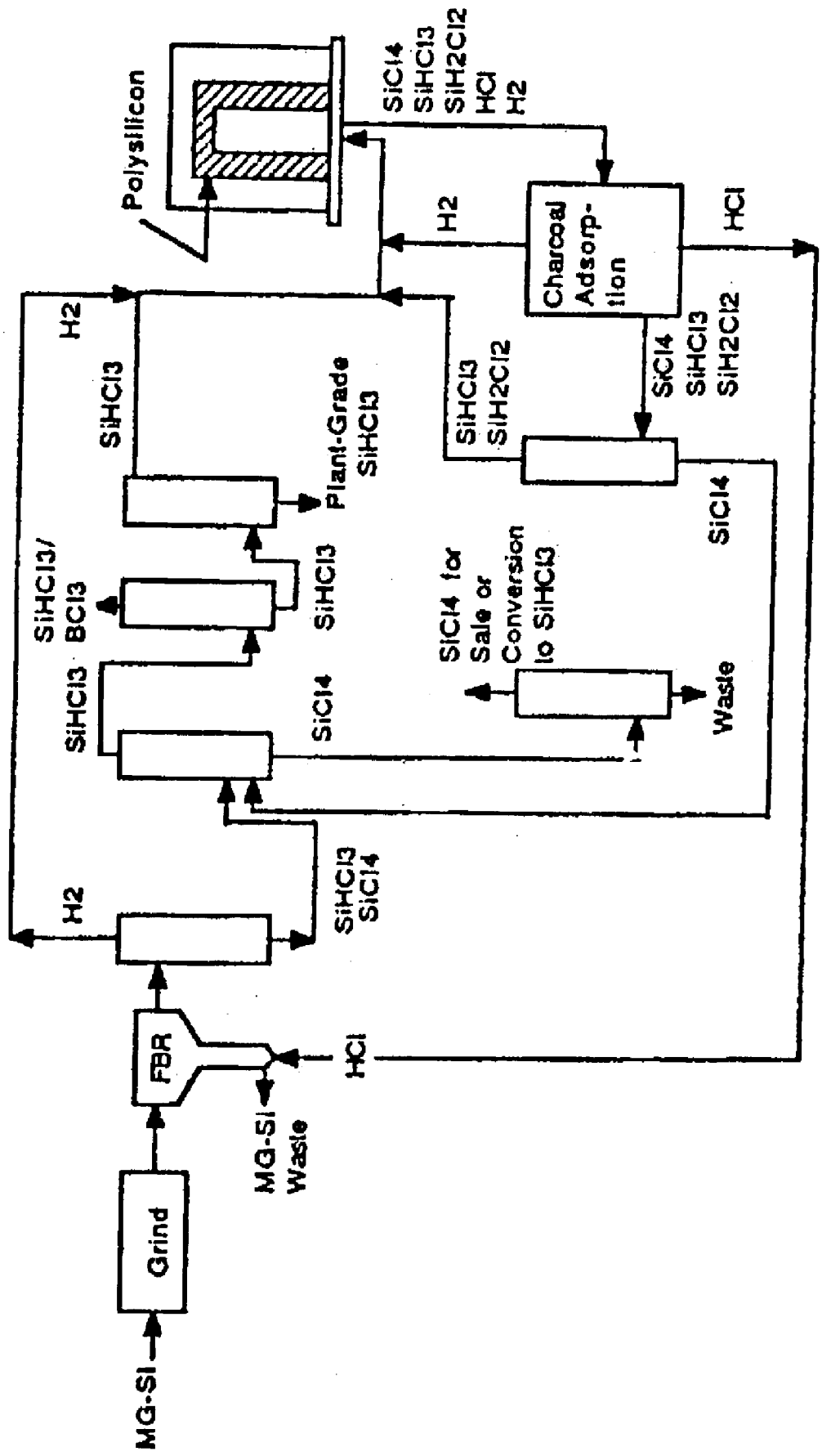
FIG. 1 is a flow diagram for silicon in the trichlorosilane decomposition process often used in the prior art to produce semiconductor-grade polysilicon.
Figure 2:
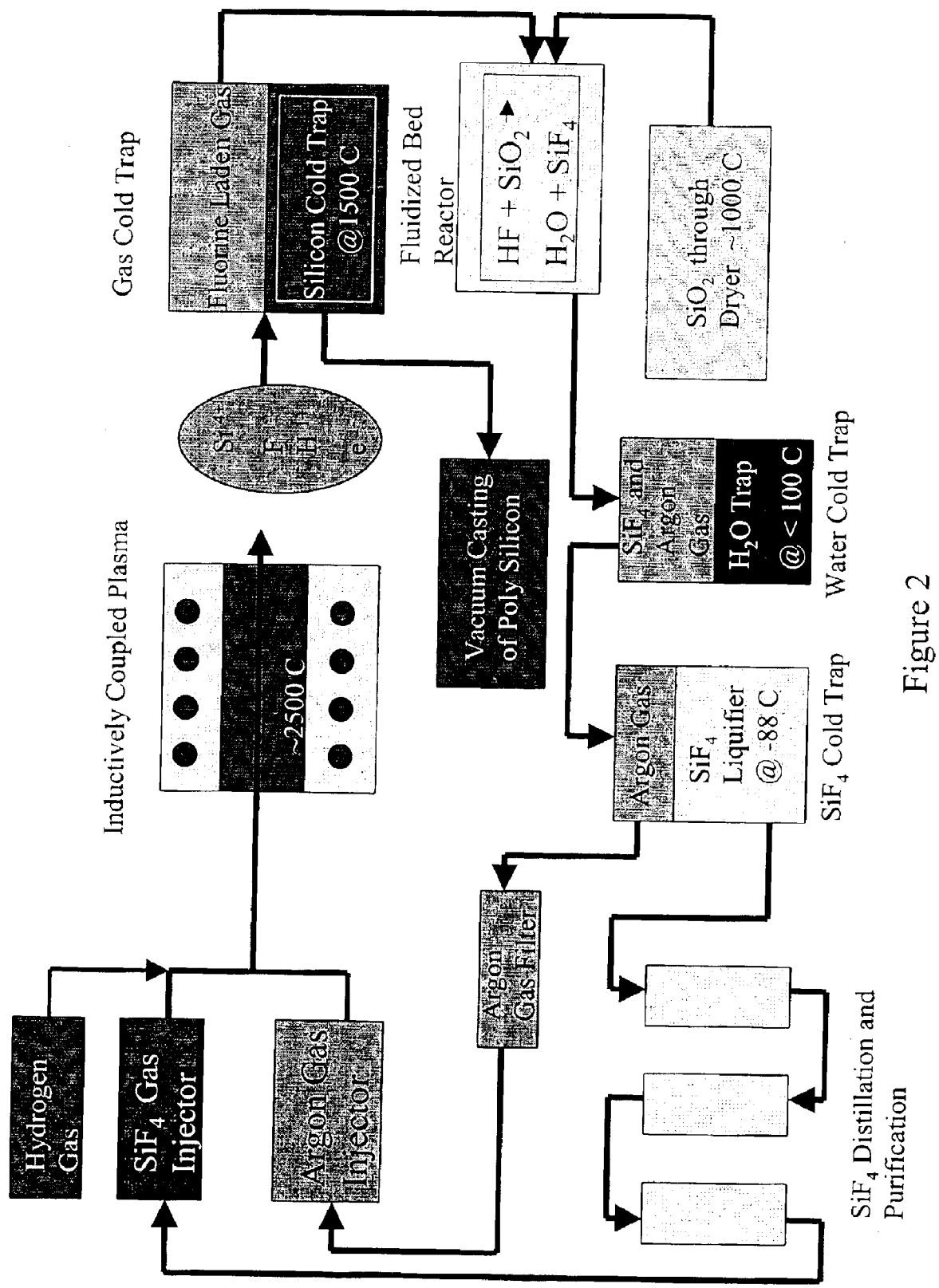
FIG. 2 is a flow diagram for the plasma production of polysilicon metal from $SiO_2/SiF_4$ precursors.

In one embodiment of the invention, the process features a fluorine based system. Referring to FIG. 2, SiF$_4$, hydrogen and argon are injected into an inductively coupled plasma operating at a temperature of approximately 2500° C. A plasma is defined as a luminous gas containing a significant fraction of ionized atoms or molecules. Plasmas, therefore, are considered to be gaseous conductors. As such, plasmas readily interact with magnetic fields, making it possible to couple a plasma to a high frequency power source. Under these conditions and in the presence of hydrogen gas, the SiF$_4$ decomposes into silicon and fluorine ions. The ions react with electrons and hydrogen ions from the ionized hydrogen gas, and the gaseous product flows into a baffled cold trap held at approximately 1500° C. by resistance heating. The Si ions react with electrons from the ionized hydrogen gas to form molten silicon metal that can be vacuum cast into polysilicon ingots. The hot hydrogen and fluorine-laden gas is drawn from the cold trap and pushed through a fluidized bed at approximately 1200° C. containing silica (SiO$_2$) particulate. Prior to the injection of the hot fluorine gas, the silica particulate is pre-heated in a dryer to approximately 1000° C. A small amount of hydrogen may be required in the fluidized bed in order to facilitate the formation of HF and begin the reaction:

$$4HF+SiO_2 \rightleftharpoons 2H_2O+SiF_4$$

The SiF$_4$ generated in the fluidized bed along with the argon carrier gas is drawn into a cold-trap at a temperature less than 100° C. Water vapor formed in the fluidized bed is removed, allowing the SiF$_4$ gas to move to a chiller or liquefier at less than −88° C. In the chiller, the SiF$_4$ gas is condensed or liquefied. The silicon carrier (liquid SiF$_4$) is then purified through a series of distillation steps at progressively higher temperatures. Standard industry practice is to allow the temperature to increase, thereby volatilizing impurities and leaving the remaining SiF$_4$ in a purer state. The purified SiF$_4$ along with hydrogen is then injected into the plasma with the filtered argon gas which acts as a carrier for the process.

The silicon source for this process is silica powder rather than metallurgical grade silicon metal. In the initial start-up of the process, high purity SiF$_4$ from a commercial source is required. Additionally, a slight amount of HF must be added in the fluidized bed to maintain an adequate fluorine carrier concentration. However, once the process is fully operational, semiconductor grade polysilicon is generated continuously with silica as the main feed material.

Figure 3:
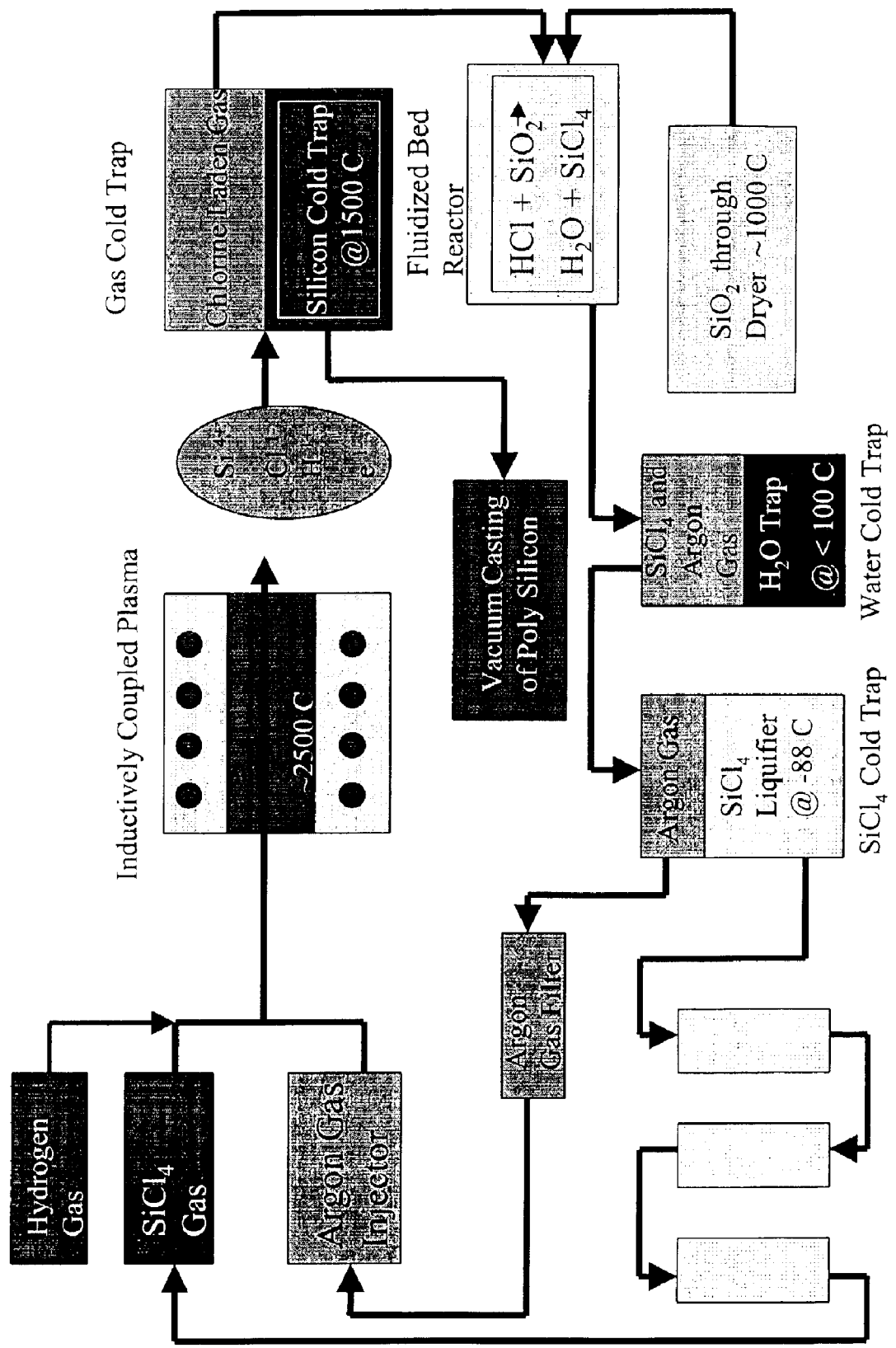
FIG. 3 is a flow diagram for the plasma production of polysilicon metal from $SiO_2/SiCl_4$ precursors.

In another embodiment of the invention, a chlorine based system is used in the method of transferring silicon from SiO$_2$ to polysilicon. The process is flexible enough to allow the use of chlorine as the halide conversion medium by modifying the process as shown in FIG. 3. Referring to FIG. 3, hydrogen, argon and a silicon chloride-containing gas are injected into an inductively coupled plasma operating at a temperature of approximately 2500° C. Under these conditions, the silicon chlorides decompose to silicon, chlorine, and possibly hydrogen ions, and the gaseous product flows into a baffled cold trap held at approximately 1500° C. by resistance heating. The Si ions react with electrons from the ionized hydrogen gas to form molten silicon metal condensate that can be vacuum cast into polysilicon ingots. The hot chlorine-laden gas is drawn from the cold trap and pushed through a fluidized bed at approximately 1200° C. containing silica (SiO$_2$) particulate. Prior to the injection of the hot chlorine gas, the silica particulate is pre-heated in a dryer to approximately 1000° C. A small amount of hydrogen is required in the fluidized bed in order to facilitate the formation of HCl gas and begin the reaction:

$$4HCl+SiO_2 \rightleftharpoons 2H_2O+SiCl_4$$

Additionally, some SiCl$_3$H will be formed by the reaction:

$$HCl+SiCl_4 \rightleftharpoons SiCl_3H+Cl_2$$

This results in a SiCl$_4$/SiCl$_3$H mixture in the fluidized bed that is then drawn along with the argon carrier gas into a cold-trap at a temperature less than 100° C. Water vapor formed in the fluidized bed is removed, allowing the SiF$_4$ gas to move to a chiller or liquefier at less than 50° C. In the chiller, the silicon gas mixture is condensed or liquefied. The silicon carrier (liquid SiCl$_4$/SiCl$_3$H mixture) is then purified through a series of distillation stages at subsequently higher temperatures. The purified SiCl$_4$/SiCl$_3$H gas mixture along with hydrogen is then injected into the plasma with the filtered argon gas, which acts as a carrier for the process.

The silicon source for this process is silica powder rather than metallurgical grade silicon metal. In the initial start-up of the process, high purity SiCl$_4$ from a commercial source is required. Additionally, a slight amount of HCl may be added to the fluidized bed to maintain an adequate chlorine carrier concentration. However, once the process is fully operational, semiconductor grade polysilicon is generated continuously with silica as the main feed material.

The use of a fluorine-based system offers some advantages over the chlorine-based system, as the fluorine ions do not generate silicon-containing fluorine compounds beyond SiF$_4$. In the chlorine-based process, the generation of additional silicon-containing chlorine compounds requires more precise temperature and flow controls. However, the use of fluorine necessitates the implementation of means to resist corrosion throughout the system. Such means are not necessary in the chlorine-based system. Thus, the chlorine-based system has the added advantage of lowering the refractory and containment costs. Further, there is an additional cost associated with maintaining the lower condensation temperature required in the SiF$_4$ cold trap and the associated subsequent SiF$_4$ distillation and purification.

Figure 4:
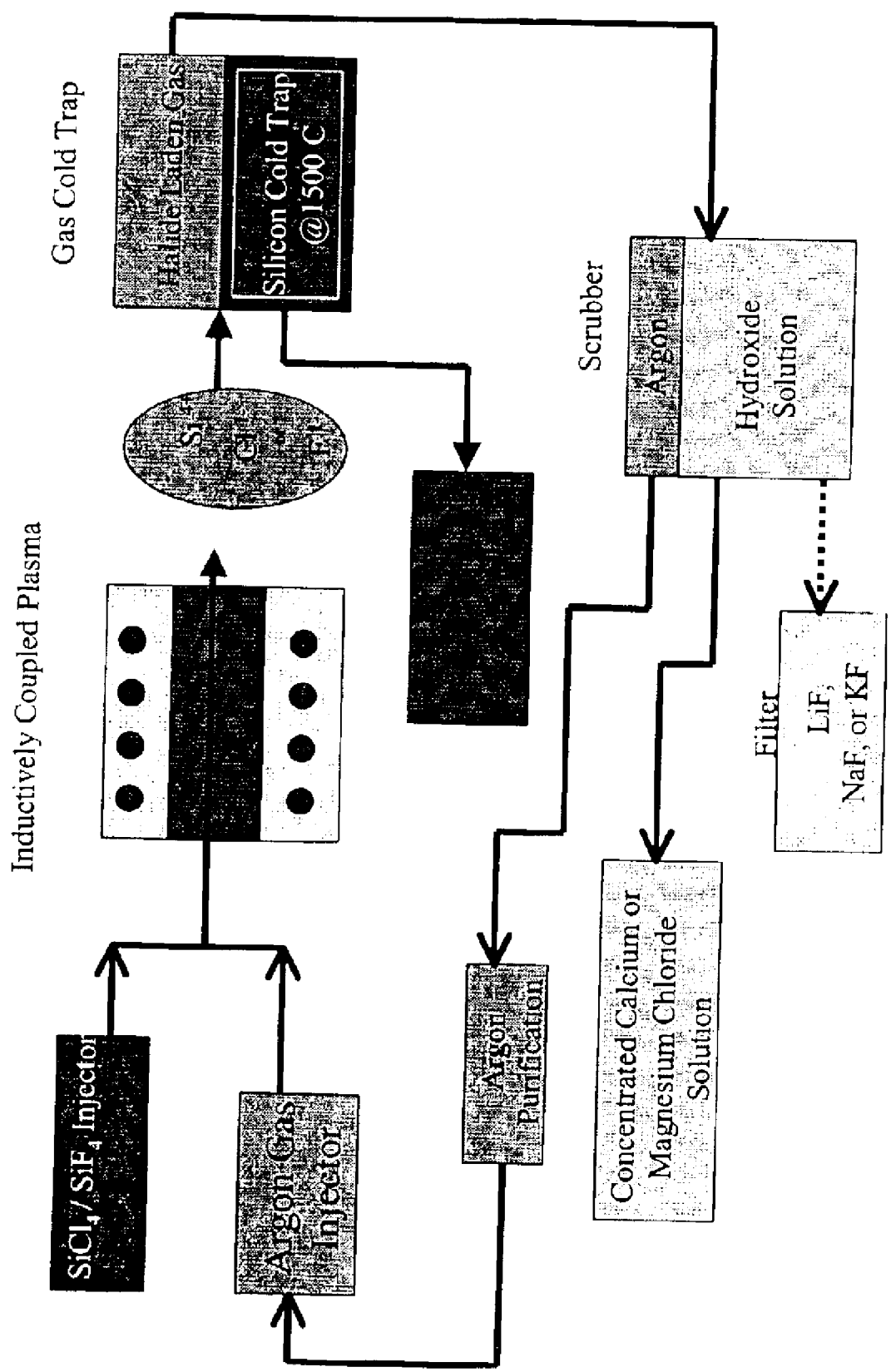
FIG. 4 is a flow diagram for one embodiment of a plasma production of polysilicon metal from $SCl_4$ or $SiF_4$ precursors of the present invention.

In another embodiment, an inexpensive source of high purity SiF$_4$ or SiCl$_4$ allows the conversion of these gasses to polysilicon without the subsequent recycling of the halide gas with SiO$_2$ to from the silicon halide. Referring to FIG. 4, the plasma will break down the silicon halide to silicon and chlorine or fluorine ions. The process is similar to those described above in that the silicon is condensed in the cold trap before being vacuum cast into polysilicon. However, the remaining halogen gases are passed through a scrubber as opposed to being passed through a fluidized bed reactor containing silica for recycling the silicon halide gas.

In the case of fluorine ions from a SiF$_4$ source, the scrubber medium is an alkali hydroxide such as LiOH, NaOH, or KOH. In this instance, the gas will react with the aqueous scrubbing solution and form a fluoride precipitate in the reaction:

Li(or Na or K)OH$_{(liquid)}$+ F$_{(gaseous\ ion)}$ $\rightleftharpoons$ Li(or Na or K)F$_{(solid)}$+OH$^-_{(in\ water)}$.

The solid alkaline fluoride can then be filtered from the resulting slurry. These fluorides have commercial value and can be sold after drying.

If SiCl$_4$ is used as the silicon source, the scrubbing solution can be either Ca(OH)$_2$ or Mg(OH)$_2$ and the gas will react with the aqueous scrubbing solution and form a chloride solution in the reaction:

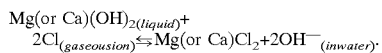

In this case, the concentrated solutions have commercial value and can be sold without further refinement.

What is claimed is:

1. A method of producing silicon metal comprising:
   a. separating $SiF_4$ gas into silicon and fluorine ions in an inductively coupled plasma in the presence of hydrogen ions created from ionized hydrogen gas; and,
   b. charging the silicon, hydrogen and fluorine ions to a cold trap wherein silicon ions react with electrons from the ionized hydrogen gas to form molten silicon metal.

2. The method of claim 1 wherein the carrier gas in the inductively coupled plasma is argon gas.

3. The method of claim 1 wherein the cold trap is held at 1500° C.

4. The method of claim 1 comprising the additional step of:
   c. vacuum casting the molten silicon metal into polysilicon ingots.

5. The method of claim 1 comprising the additional steps of:
   c. charging fluorine-laden gas from the cold trap to a fluidized bed containing silica to form $SiF_4$ gas;
   d. drawing the $SiF_4$ gas formed in the fluidized bed into a second cold trap to remove water vapor;
   e. charging de-watered $SiF_4$ gas formed in the second cold trap to a liquefier to condense the de-watered $SiF_4$ gas and form $SiF_4$ liquid; and,
   f. distilling the condensed $SiF_4$ liquid to form purified $SiF_4$ gas for injection into the inductively coupled plasma.

6. The method of claim 5 wherein the fluidized bed is held at about 1200° C.

7. The method of claim 5 wherein the silica is pre-heated to about 1000° C.

8. The method of claim 5 wherein hydrogen gas is charged to the fluidized bed.

9. The method of claim 5 wherein the second cold trap is held at less than about 100° C.

10. The method of claim 5 wherein the liquefier is held at less than about –88° C.

11. The method of claim 5 comprising the additional step of adding argon gas to the purified $SiF_4$ gas for injection into the inductively coupled plasma.

12. The method of claim 1 comprising the additional steps of:
   c. charging fluorine-laden gas from the cold trap to a fluidized bed containing silica to form $SiF_4$ gas; and,
   d. purifying the $SiF_4$ gas formed in the fluidized bed to form purified SiF4 gas for injection into an inductively coupled plasma.

13. A method of producing silicon metal comprising:
   a. separating a silicon chloride gas into silicon and chlorine ions in an inductively coupled plasma in the presence of hydrogen ions created from ionized hydrogen gas; and,
   b. charging the silicon, hydrogen and chlorine ions to a cold trap wherein silicon ions react with electrons from the ionized hydrogen gas to form molten silicon metal.

14. The method of claim 13 wherein the silicon chloride gas is $SiCl_4$.

15. The method of claim 13 wherein the silicon chloride gas is $SiCl_3H$.

16. The method of claim 13 wherein the silicon chloride gas comprises a mixture of $SiCl_4$ and $SiCl_3H$.

17. The method of claim 13 wherein the carrier gas in the inductively coupled plasma is argon gas.

18. The method of claim 13 wherein the cold trap is held at 1500° C.

19. The method of claim 13 comprising the additional step of:
   c. vacuum casting the molten silicon metal into polysilicon ingots.

20. The method of claim 13 comprising the additional steps of:
   c. charging chloride-laden gas from the cold trap to a fluidized bed containing silica to form silicon chlorine gases;
   d. drawing the silicon chlorine gases formed in the fluidized bed into a second cold trap to remove water vapor;
   e. charging de-watered silicon chlorine gases formed in the second cold trap to a liquefier to condense the de-watered silicon chlorine gases and form silicon chlorine liquids; and,
   f. distilling the condensed silicon chlorine liquids to form purified silicon chlorine gases for injection into the inductively coupled plasma.

21. The method of claim 20 wherein the silicon chlorine gases comprise $SiCl_4$.

22. The method of claim 20 wherein the silicon chlorine gases comprise $SiCl_3H$.

23. The method of claim 20 wherein the silicon chlorine gases comprise a mixture of $SiCl_4$ and $SiCl_3H$.

24. The method of claim 20 wherein the fluidized bed is held at about 1200° C.

25. The method of claim 20 wherein the silica is pre-heated to about 1000° C.

26. The method of claim 20 wherein hydrogen gas is charged to the fluidized bed.

27. The method of claim 20 wherein the second cold trap is held at less than about 100° C.

28. The method of claim 20 wherein the liquefier is held at less than about 50° C.

29. The method of claim 20 wherein argon gas is used as a carrier gas with the silicon chloride gas.

30. The method of claim 13 comprising the additional steps of:
   c. charging fluorine-laden gas from the cold trap to a fluidized bed containing silica to form $SiF_4$ gas; and,
   d. purifying the $SiF_4$ gas formed in the fluidized bed to form purified $SiF_4$ gas for injection into an inductively coupled plasma.

31. A method of producing polysilicon comprising:
   a. separating a silicon halide gas into silicon and halide ions in an inductively coupled plasma in the presence of hydrogen ions created from ionized hydrogen gas; and,
   b. charging the silicon, hydrogen and halide ions to a cold trap wherein Si ions react with electrons from the ionized hydrogen gas to form molten silicon metal.

32. The method of claim 31, wherein the silicon halide gas is selected from the group consisting of $SiF_4$, $SiCl_4$, $SiCl_3H$, and mixtures thereof.

33. The method of claim 31, comprising the additional step of adding a carrier gas to the silicon halide gas before the separating step.

34. The method of claim 31 wherein the cold trap is held at about 1500° C.

35. The method of claim 31 comprising the additional step of:
   c. vacuum casting the molten silicon metal into polysilicon ingots.

36. The method of claim 33 comprising the additional steps of:
   c. charging halide-laden gas from the cold trap to a scrubber wherein the carrier gas from the halide-laden gas;
   d. purifying the separated carrier gas for injection into an inductively coupled plasma.

37. The method of claim 36, wherein the silicon halide gas is selected from the group consisting of $SiF_4$, $SiCl_4$, $SiCl_3H$, and mixtures thereof.

38. The method of claim 36, wherein the scrubber comprises a hydroxide-containing solution.

39. The method of claim 38, wherein the silicon halide gas comprises $SiF_4$ and, wherein the hydroxide-containing solution is selected from the group consisting of LiOH, NaOH, KOH and a mixture thereof.

40. The method of claim 39, wherein the hydroxide-containing solution is NaOH.

41. The method of claim 39, wherein the hydroxide-containing solution reacts with the halide gas to form a member of the group consisting of LiF, NaF, KF and a combination thereof.

42. The method of claim 38, wherein the silicon halide gas comprises a member of the group consisting of $SiCl_4$, $SiCl_3H$, and mixtures thereof, and wherein the hydroxide-containing solution is selected from the group consisting of $Mg(OH)_2$, $Ca(OH)_2$ and a mixture thereof.

43. The method of claim 42, wherein the hydroxide-containing solution reacts with the halide gas to form a member of the group consisting of $CaCl_2$, $MgCl_2$ and a combination thereof.

* * * * *